US010033333B2

(12) United States Patent
Raghavan et al.

(10) Patent No.: US 10,033,333 B2
(45) Date of Patent: Jul. 24, 2018

(54) UNIVERSAL RF AMPLIFIER CONTROLLER

(71) Applicant: pSemi Corporation, San Diego, CA (US)

(72) Inventors: Harish Raghavan, San Diego, CA (US); Keith Bargroff, San Diego, CA (US); Poojan Wagh, Sleepy Hollow, IL (US)

(73) Assignee: pSemi Corporation, San Diego, CA (US)

( * ) Notice: Subject to any disclaimer, the term of this patent is extended or adjusted under 35 U.S.C. 154(b) by 0 days.

(21) Appl. No.: 15/698,218

(22) Filed: Sep. 7, 2017

(65) Prior Publication Data

US 2018/0131326 A1 May 10, 2018

Related U.S. Application Data

(63) Continuation-in-part of application No. 15/258,806, filed on Sep. 7, 2016.

(51) Int. Cl.
*H03F 1/02* (2006.01)
*H03F 3/24* (2006.01)
*H03F 3/193* (2006.01)
*H03G 3/30* (2006.01)
*H03F 1/30* (2006.01)

(52) U.S. Cl.
CPC ........... *H03F 1/0205* (2013.01); *H03F 1/301* (2013.01); *H03F 3/193* (2013.01); *H03F 3/245* (2013.01); *H03G 3/3042* (2013.01); *H03F 2200/375* (2013.01); *H03F 2200/447* (2013.01); *H03F 2200/451* (2013.01)

(58) Field of Classification Search
CPC ...................................... H03F 1/0205
See application file for complete search history.

(56) References Cited

U.S. PATENT DOCUMENTS

| 8,330,546 | B2* | 12/2012 | Ripley | H03F 1/52 330/140 |
| 8,604,777 | B2* | 12/2013 | Doogue | G01R 15/148 323/277 |
| 2008/0100382 | A1* | 5/2008 | Fisher | H03F 1/302 330/288 |
| 2012/0139636 | A1* | 6/2012 | Scott | H03G 3/3042 330/285 |

(Continued)

OTHER PUBLICATIONS

Nguyen, Patricia T., Notice of Allowance received from the USPTO dated Apr. 30, 2018 for U.S. Appl. No. 15/258,806, 7 pgs.

*Primary Examiner* — Patricia T Nguyen
(74) *Attorney, Agent, or Firm* — Jaquez Land Greenhaus LLP; Martin J. Jaquez, Esq.; Alessandro Steinfl, Esq.

(57) ABSTRACT

Various methods and circuital arrangements for controlling an RF amplifier while reducing size, cost and power consumption are presented. Included is an amplifier controller unit that provides different current amplification stages, via corresponding calibration and control blocks, that can be used for calibrating an output power of the RF amplifier based on a reference current. Order of the current amplification stages starting from the reference current allow reduction in size, cost and power consumption. A fixed or programmable offset current may be added to an output current provided by a current amplification stage.

30 Claims, 10 Drawing Sheets

(56) References Cited

U.S. PATENT DOCUMENTS

| | | | |
|---|---|---|---|
| 2012/0194274 A1* | 8/2012 | Fowers | H03F 1/0238 330/293 |
| 2014/0266458 A1* | 9/2014 | Scott | H03F 3/195 330/291 |
| 2016/0330049 A1* | 11/2016 | Roh | H04L 25/06 |
| 2018/0069509 A1 | 3/2018 | Wagh et al. | |

* cited by examiner

UNIVERSAL RF AMPLIFIER CONTROLLER

CROSS REFERENCE TO RELATED APPLICATIONS

The present application is a continuation in part of U.S. application Ser. No. 15/258,806 filed on Sep. 7, 2016, entitled "Universal RF Amplifier Controller", the disclosure of which is incorporated herein by reference in its entirety.

BACKGROUND

1. Field

The present application relates to amplifiers. In particular, the present application relates generally to systems, methods, and devices for use in calibrating and manufacturing radio frequency (RF) amplifiers, including power amplifiers, PAs, where an amplifier controller may be used.

2. Description of Related Art

In applications where RF power amplifiers are used, limits may be applied to output power in order to meet system requirements. In such cases, both upper and lower limits on output power may be ensured by calibrating circuit blocks which control output power as a function of various parameters, including temperature compensation, bias calibration, user desired calibration and D/A Converter, DAC, scaling (register value). The calibration values of each block can be multiplicative with each other, and the order in which they are physically implemented in a multiplicative chain can have a large effect on size, power consumption and overall efficiency of the power amplifier. The current invention describes optimum conditions for implementation of these various calibration circuits as well as an optimized temperature compensation subsystem.

SUMMARY

According to a first aspect of the present disclosure, a circuital arrangement is presented, the circuital arrangement comprising: a plurality of calibration and control blocks arranged in a cascaded configuration, each calibration and control block of the plurality of calibration and control blocks configured to act on an input current to provide a calibrated output current that is an amplified version of the input current according to a current amplification range of the each calibration and control block, the current amplification range having a low value and a high value; and an offset current generator configured to generate an offset current that is added to the calibrated output current of one calibration and control block of the plurality of calibration and control blocks, wherein the plurality of calibration and control blocks are configured to amplify a reference current provided to a first calibration and control block of the plurality of calibration and control blocks and generate a calibrated control current adapted to control an output power of a radio frequency (RF) amplifier.

According to a second aspect of the present disclosure, a method for controlling an output power of a radio frequency (RF) amplifier is presented, the method comprising: providing a plurality of calibration and control blocks arranged in a cascaded configuration, each calibration and control block of the plurality of calibration and control blocks configured to act on an input current to provide a calibrated output current that is an amplified version of the input current according to a current amplification range of the each calibration and control block, the current amplification range having a low value and a high value; and adding an offset current to the calibrated output current of one calibration and control block of the plurality of calibration and control blocks, wherein the plurality of calibration and control blocks are configured to amplify a reference current provided to a first calibration and control block of the plurality of calibration and control blocks and generate a calibrated control current adapted to control the output power of the radio frequency (RF) amplifier.

BRIEF DESCRIPTION OF DRAWINGS

The accompanying drawings, which are incorporated into and constitute a part of this specification, illustrate one or more embodiments of the present disclosure and, together with the description of example embodiments, serve to explain the principles and implementations of the disclosure.

Like reference numbers and designations in the various drawings indicate like elements.

DETAILED DESCRIPTION

Throughout the present disclosure, embodiments and variations are described for the purpose of illustrating uses and implementations of inventive concepts of various embodiments. The illustrative description should be understood as presenting examples of the inventive concept, rather than as limiting the scope of the concept as disclosed herein.

Cellular phones have increased in popularity largely due to their ability to provide both voice and data on an anywhere, any time basis. Such popularity has driven exponential increases in data demand on cellular nodes, which in turn has forced development of increasingly complex air interface and modulation techniques. A current such system is called Long Term Evolution—Carrier Aggregation, or LTE-CA. LTE-CA sets strict requirements on all power amplifiers operating on the network, especially requiring all handsets using such power amplifiers to operate within strict limits on output power over all operating conditions. Other specifications such as frequency of operation, band switching times and linearity are also set by the specification and other requirements such as power added efficiency, PAE, are set by handset operators to ensure long battery life. These requirements have to be met by all handsets and under a variety of conditions, especially over manufacturing variations, substantial temperature range and over battery voltages. A manufacturer of RF amplifiers, such as power amplifiers, therefore, has to ensure that all such conditions are met, compensating for variations in components and manufacturing control. In addition, the design of the RF amplifier (e.g., PA) should allow for changes during operation, such as temperature and possible component aging (e.g., battery output voltage), while minimizing size, cost and power consumption of the RF amplifier.

Figure 1:
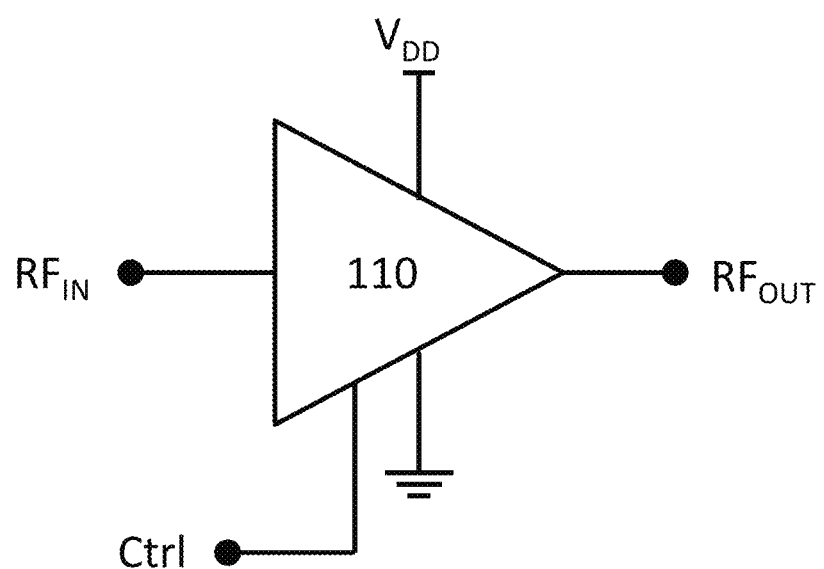
FIG. 1 shows a prior art embodiment of an RF amplifier where a control signal can affect a power output of the Amplifier.

One method of ensuring compliance with a standard is to use high precision components or to pre-test all components used in the RF amplifier to meet a technical limit. A resulting RF amplifier can meet design targets without use of calibration and/or compensation. This is shown in FIG. 1, where a circuit (100) comprising such RF Amplifier (110), operating from a supply voltage, $V_{DD}$, is shown. The RF amplifier (110), which can be a power amplifier, by way of its high precision and/or pre-tested components can meet design specification without the use of calibration and/or compensation circuits. A control signal, Ctrl, input to the amplifier, can precisely control a target output power of the amplifier (110) according to the design of the amplifier and under all (designed for) conditions of operation of the amplifier (e.g., temperature, aging, etc.). In other words, under all designed-for (normal) conditions of operation, the actual output power of the RF amplifier (110) in response to a given value of the control signal, Ctrl, is as expected by the design of the amplifier.

The approach used in the design and fabrication of the RF amplifier (110) of FIG. 1 may be justified in very high value systems due to cost and time constraints. Products of mass production using RF amplifiers, such as, for example, cellular phones, tablets or devices in the Internet of Things (IoT), cannot afford this approach, so they are generally built using standard components and calibrated as part of the manufacturing process. As discussed above, power amplifiers are particularly important as they can be subject to a wide range of requirements, and therefore, the inherent variation in their components (e.g. components tolerance) has made calibration a common element of their manufacture.

Figure 2:
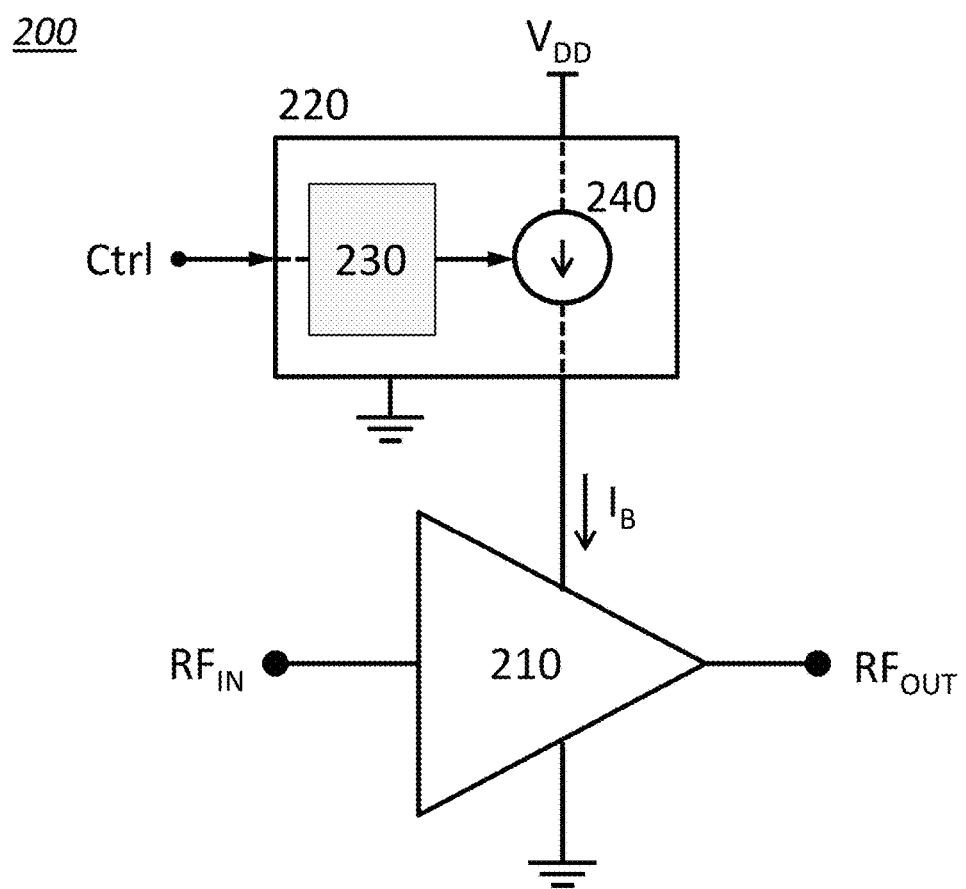
FIG. 2 shows a prior art embodiment of an RF amplifier where a controller unit is used to provide a bias current to the RF amplifier which determines output power of the RF amplifier.

In order to address deviation from desired output characteristics of an RF amplifier based on variation, for example, in components and temperature, a controller unit may be used to calibrate specific operating parameters of the RF amplifier. In a case of output power calibration, the controller unit may calibrate a bias current of the RF amplifier which determines an output power of the amplifier, including a range of the bias current (minimum current, maximum current) which determines an output power range of the amplifier. A compensation circuit may be also added to compensate for a drift of the calibrated bias current with respect to a variation of the temperature. This is shown in FIG. 2, where a controller unit (220), through a calibration and compensation unit (230), calibrates and compensates a current, $I_B$, generated by a current source (240) of the controller unit (220), where the current, $I_B$, is provided to an RF amplifier (210) to establish an output power of the output, $RF_{OUT}$, of the RF amplifier (210). A control signal, Ctrl, may control the controller unit (220) to output a current, $I_B$, to the amplifier (210), so as to obtain a desired (calibrated and compensated) output power at the amplifier output, $RF_{OUT}$.

The calibration and compensation unit (230) of the controller unit (220) of FIG. 2 may be used to calibrate the current $I_B$ based on a desired output power range of the RF amplifier (210), as well as, compensating for drifts in the output current, $I_B$, based on a temperature variation (local temperature). Accordingly, the calibration and compensation unit (230) may comprise various analog and/or digital circuit blocks tailored to provide the functions of calibration and compensation of the current $I_B$. Such circuit blocks may include one or more current mirror circuits, such as the exemplary current mirror circuit (300) depicted in FIG. 3, which use relative sizes of transistors in the current mirror to provide the function of a multiplication of a reference current for the purpose of calibrating the reference current to a desired calibrated value.

Figure 3:
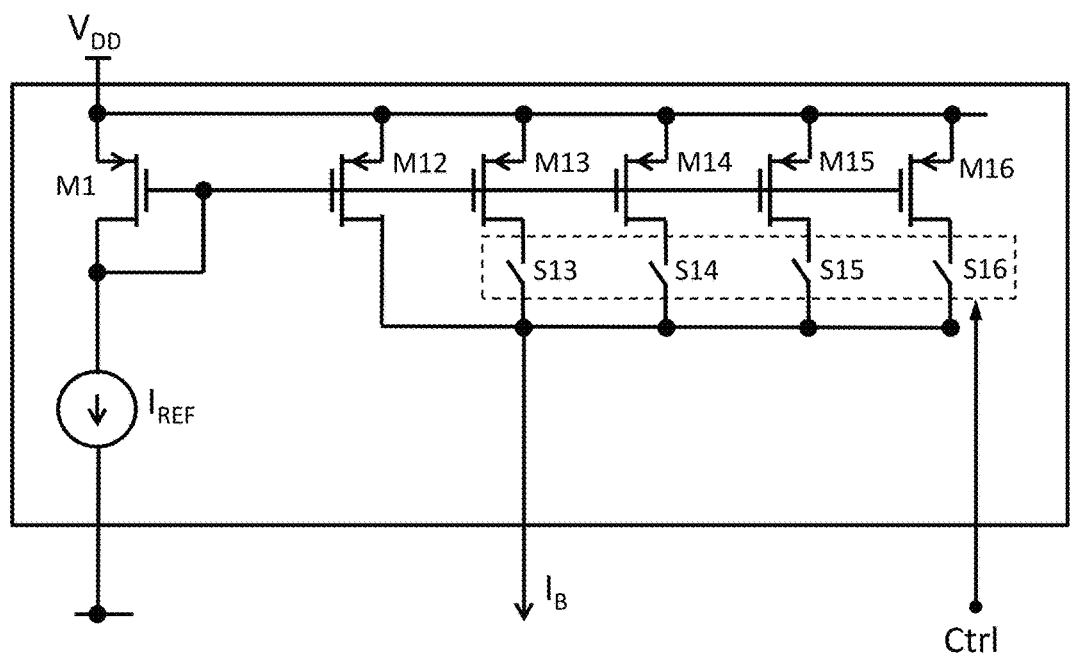
FIG. 3 shows an exemplary embodiment of a simplified parametric current mirror circuit where relative sizes of transistors in a current mirror are used to multiply a reference current.

With further reference to the current mirror (300) circuit of FIG. 3, a reference current, $I_{REF}$, flowing through a first leg of the current mirror (300) defined by a transistor M1, then a current $I_B$ in a second leg of the current mirror (300) is a multiplicative factor, $N_m$, of the current $I_{REF}$, $I_B = N_m * I_{REF}$, where the multiplicative factor $N_m$ is defined by a relative size of a transistor in the second leg through which the current $I_B$ flows with respect to a size of the transistor M1 through which the current $I_{REF}$ flows. As can be seen in FIG. 3, current through the second leg of the current mirror (300) can flow through a combination of the transistor M12 and one or more of selectable parallel transistors (M13, M14, M15, M16), where the transistors (M13 ... M16) can each be selectively included and excluded from conducting a portion of the current $I_B$ via respective switches (S13 ... S16). Accordingly, the multiplicative factor $N_m$ is a parametric factor that is a function of the sum of the sizes of the included transistors in the second path with respect to the size of transistor M1, and is determined by positions of the switches (S13 ... S16). For example, if transistors M1 has a nominal size of 1 and transistors (M12, M13, M14, M15, M16) have respective nominal sizes (1, 2, 4, 8, 16), if all selectable transistors (M13, M14, M15, M16) are included in the second leg, then $N_m = 1+2+4+8+16=31$. If all selectable transistors (M13, M14, M15, M16) are excluded from the second leg, then $N_m = 1$. A person skilled the art would understand that a range of a value of the multiplicative factor $N_m$ can be designed to be any range (not necessarily of integer value) by careful selection of the relative sizes of the transistors in the first and second legs of the current mirror circuit (300).

The controller unit (220) of FIG. 2 may implement calibration of the current $I_B$ and a range of the current $I_B$ by cascading several current multiplication circuit blocks (e.g.

current mirror (300) of FIG. 3). A person skilled in the art would understand that manipulation of higher currents can require larger size devices (e.g., transistors) to handle the larger currents, and which in turn, can require larger physical areas (e.g., layout area of an integrated chip, IC) to implement such larger size devices. As the current $I_B$ may have a wide range covering a low current (e.g. in μA's), and a high current (e.g. mA's) that may be few orders of magnitude larger than the low current, calibration of the current $I_B$ may require handling of large currents and therefore usage of said larger device sizes. The teachings according to the present disclosure provide methods and apparatus to reduce the size of a physical area required for implementation of the controller unit (220) by selecting specific order in the current multiplication circuit blocks.

With further reference to FIG. 2, the controller unit (220) and the amplifier (210) may each be fabricated separately and integrated at a later stage to provide the functionality of the RF amplifier module (200), where the control signal, Ctrl, determines a calibrated output power of the RF amplifier (210). In turn, the RF amplifier module (200) may be integrated at a later stage into a product, such as a handheld cellular phone, for transmitting an RF signal (e.g., to a base station). Power of such transmitted RF signal may be subject to a specific output power range prescribed by a specification of an air interface supported by the cellular phone. As the cellular phone may support more than one air interface, different specific output power ranges may need to be supported by the cellular phone. It can therefore be desirable to provide different calibration functions through the controller unit (220) so as to allow calibration of the output power (e.g. a corresponding current) at the different manufacturing and usage steps of the controller unit (220), as depicted in FIG. 4A.

Figure 4A:
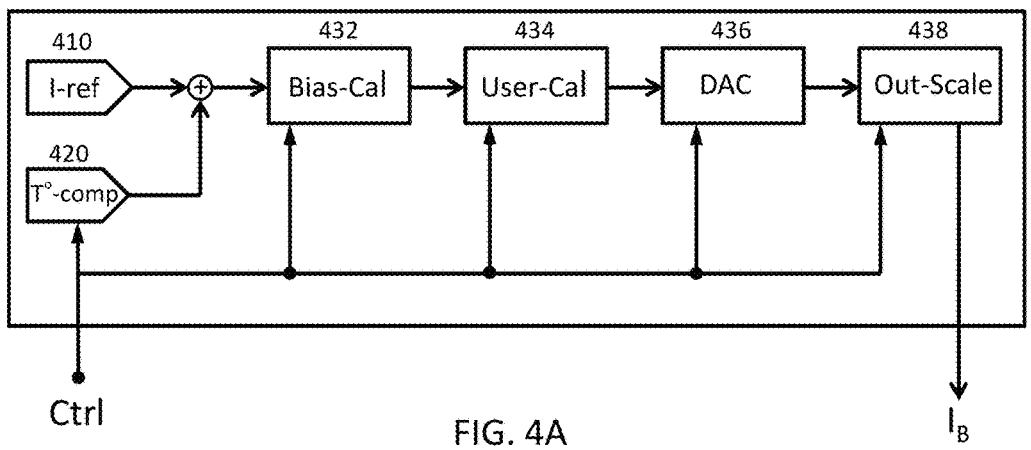
FIG. 4A and FIG. 4B show block diagrams of exemplary embodiments according to the present disclosure of amplifier controller units where multiplicative current chains are used, the multiplicative current chains comprising calibration and control blocks arranged in a specific order.

A simplified block diagram of an amplifier controller unit (400A) according to an embodiment of the present disclosure, which can be used in the amplifier module (200) of FIG. 2, is shown in FIG. 4A. The amplifier controller unit (400A) can provide different calibration functions, and temperature compensation, of an output current, $I_B$, of the amplifier controller unit (400A). The output current $I_B$ is based on a reference current $I_{REF}$ generated in a reference current generation block (410), which is temperature compensated through a temperature compensation block (420), and scaled up through a multiplicative current chain comprising one or more calibration and control blocks (432, 434, 436, 438). Each of the calibration and control blocks (432, 434, 436, 438) performs a multiplication of a respective input current to a parametric factor, $N_m$, which can therefore provide a scaling function of the input current. According to an embodiment of the present disclosure, each calibration and control block (433, 434, 436, 438) can be a calibration and control block that acts on an input current to provide an output current that is an amplified version of the input current, such as, for example, a variable-gain amplifier. A person skilled in the art would know of various design examples to implement such calibration and control block. It should be noted that the expression "calibration and control" as used herein, may refer to circuit blocks that may be used as calibration, control, or calibration and control, of current (and therefore of a power), via, as described above, a multiplication of a respective input current to a parametric factor.

Figure 5:
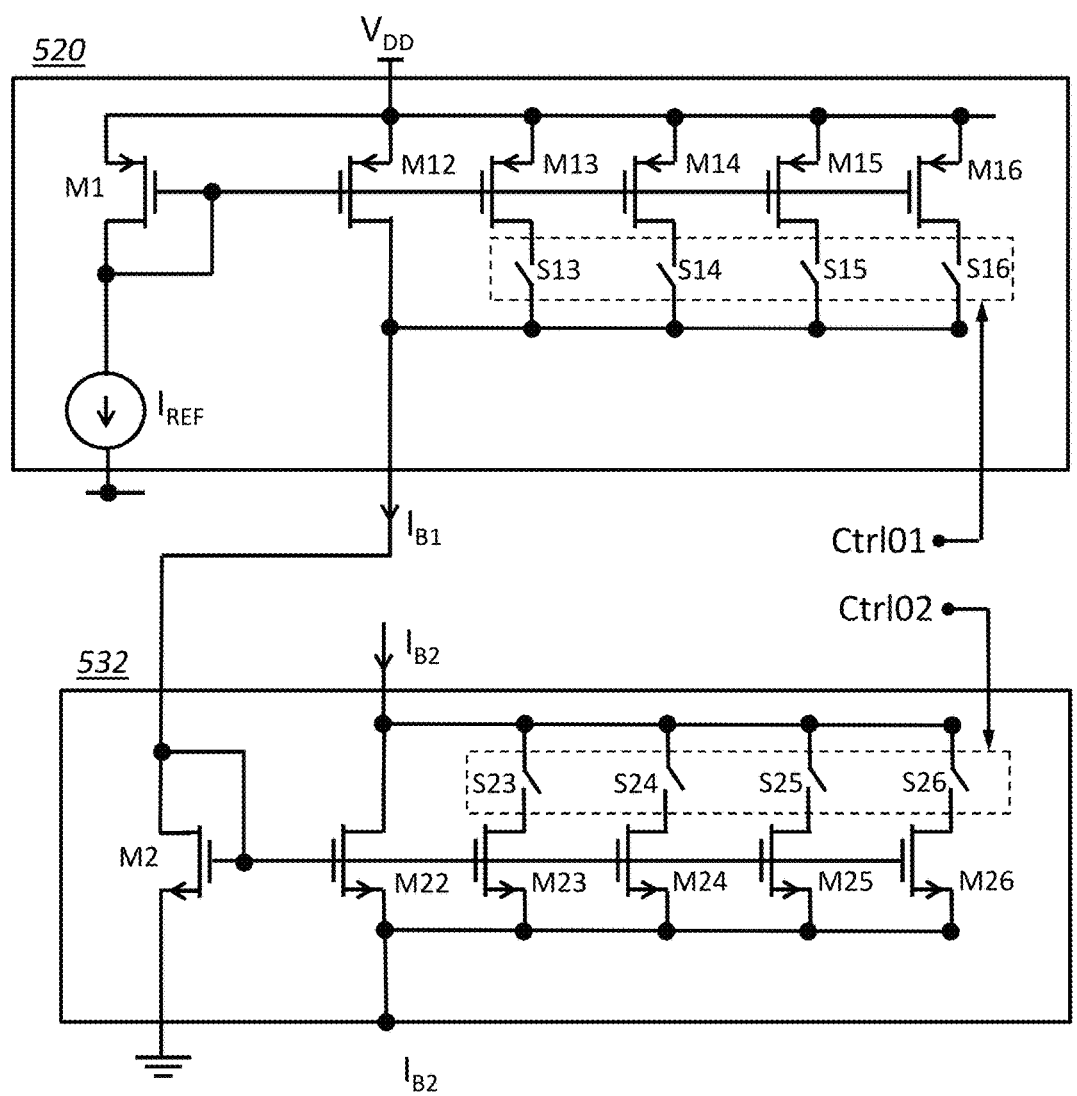
FIG. 5 shows an exemplary embodiment of a coupling between two calibration and control blocks of the multiplicative current chains depicted in FIG. 4A and FIG. 4B.

According to an exemplary and non-limiting embodiment of the present disclosure, the calibration and control blocks (432, 434, 436, 438) can each be a current mirror similar to the current mirror (300) shown in FIG. 3. An exemplary coupling between two such blocks is shown in FIG. 5, where a current $I_{B1}$ output from a first block (520) is input to a second block (532) and used as a reference current of a first leg of a current mirror of the second block (532) defined by a transistor M2. The second leg of the current mirror of the second block (532) provides a multiplication of the current $I_{B1}$ in the first leg by a parametric factor controlled by settings of the switches (S23, S24, S25, S26) in a manner similar to one described with respect to the description of the current mirror (300) of FIG. 3. It should be noted that the current mirrors in the two coupled blocks (520, 532) use opposite type transistors (P-type for 520, N-type for 532) so as to allow the coupling. In general, using such current mirrors coupled to one another for multiplying currents through various stages may require coupled current mirrors made up of alternating types of transistor devices. The output current $I_{B2}$ of the second block (532) is therefore equal to its input current, $I_{B1}$, multiplied by the parametric multiplicative factor, $N_m$, of the second block (532). A person skilled in the art would realize that the opposite type transistors used in the current mirrors of blocks (520, 532) allow to either source an output current (e.g., $I_{B1}$), or sink an output current (e.g., $I_{B2}$).

Figure 4B:
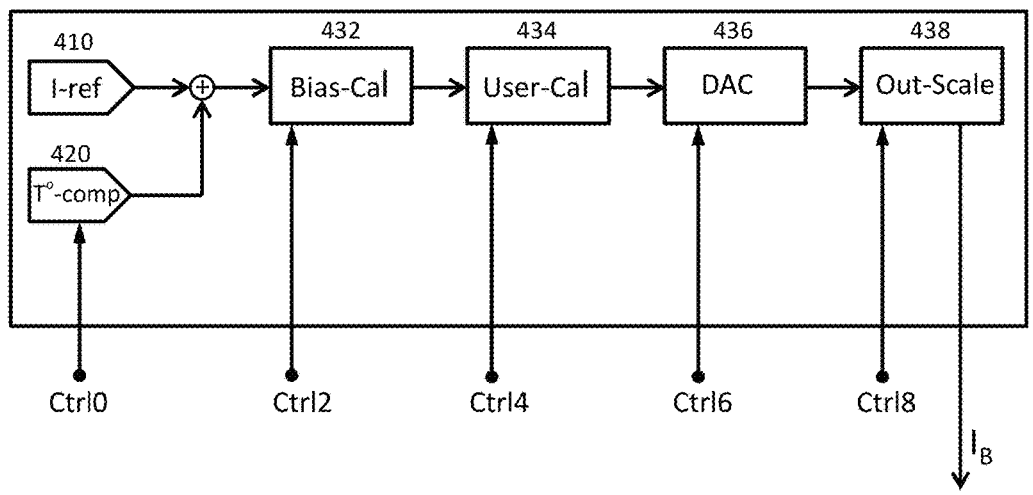

Calibration functions provided by the calibration and control blocks (432, 434, 436, 438), as well as the temperature compensation block (420) may be performed via the control signal, Ctrl, which although shown as a single signal in FIG. 4A, may include separate control lines to each of the calibration and control blocks, as depicted in FIG. 4B. Alternatively, same lines may be shared amongst the various calibration and control blocks for implementing a higher level interface protocol for controlling such blocks. A person skilled in the art would know of various such interface protocols and underlying physical links.

With further reference to the amplifier controller unit (400A) of FIG. 4A, according to an embodiment of the present disclosure the order in which the calibration and control blocks (432, 434, 436, 438) are placed in the multiplicative current chain, can allow for a reduction in a size of a physical area required by the amplifier controller unit (400A) by placing calibration and control blocks according to their respective provided current gains (which typically set the size of required transistors of the calibration and control blocks), from low gain to high gain. This allows usage of smaller size transistor devices in the first calibration and control blocks (e.g., 432, 434) to handle smaller currents provided by the lower current gains, and gradually increase the size of the transistor devices in the later blocks (e.g. 436, 438) to handle larger currents provided by the higher current gains.

With continued reference to FIG. 4A, according to an exemplary embodiment of the present disclosure, the calibration and control blocks (324, 434) may provide a current gain range of [0.75, 1.25] (e.g., $N_m$=0.75 to 1.25), the calibration and control block (436) may provide a gain range of [1, 16] (e.g., $N_m$=1 to 16), and the calibration and control block (438) may provide a gain range of [1, 32] (e.g., $N_m$=1 to 32). Accordingly, the size of the transistor devices used in the calibration and control block (434) may be 1.25 times larger than the size of the transistors devices used in the calibration and control block (432), the size of the transistor devices used in the calibration and control block (436) may be 16 times larger than the size of the transistors devices used in the calibration and control block (434), and the size of the transistor devices used in the calibration and control block (438) may be 32 times larger than the size of the transistors devices used in the calibration and control block (436). A person skilled in the art would appreciate the benefits provided by the amplifier controller unit (400A) according to the present disclosure, which can provide flexibility of various current calibration functions (e.g., by blocks 432, 434, 436, 438) while minimizing size of transistor devices used to implement such calibration functions, and therefore, reduce power consumption and physical size of the amplifier controller unit (400A).

The amplifier controller unit (400A) shown in FIG. 4A can provide a bias current calibration function (Bias-Cal) through the calibration and control block (432), which can be used to provide a calibrated bias current at its output, the calibrated bias current being based on the temperature compensated reference current $I_{REF}$. According to an exemplary, non-limiting embodiment, the bias calibration function can calibrate the temperature compensated reference current, $I_{REF}$, to within a range of +/−25% (current gain of 0.75 to 1.25) to provide the calibrated bias current. A value of calibrated bias current provided by the bias calibration function can be according to an internal specification of the amplifier controller unit (400A) and used as a reference value. For example, the manufacturer of the amplifier controller unit (400A) may want to set, during a testing phase of the amplifier controller unit, a gain of the calibration and control block (432) such that to obtain a calibrated bias current having an exemplary reference value of 180 and then may lock the gain setting. Locking of the gain setting may be performed via a fuse block, a write-once memory location, or any other method known to a person skilled in the art. The manufacturer of the amplifier controller unit (400A) may also verify that based on the reference value of the calibrated bias current, the output current $I_B$ can be according to a design range given the calibration functions provided by downstream calibration and control blocks (434, 436, 438).

Similarly, during a calibration phase of an RF amplifier module (e.g., 200 of FIG. 2), a manufacturer of the RF amplifier module (200) may use a user calibration function (User-Cal) of the amplifier controller unit (400A) provided by the calibration and control block (434) to further calibrate the calibrated bias current provided by the calibration and control block (432) according to a requirement of the RF amplifier (210). This can allow, for example, the manufacturer of the RF amplifier module (200) to use different RF amplifiers (210) with different bias current requirements starting from a same (similarly calibrated) amplifier controller unit (400A). Such different amplifier units may be different according to various parameters, such as, for example, due to RF amplifier (210) technology/type, and/or associated components tolerances, and/or manufacturing variance of the RF amplifier (210). The manufacturer of the RF amplifier module (200) may also verify that given the user calibrated bias current, downstream current amplification blocks (436, 438) can provide an output power of the RF amplifier module (200) according to a target specification. As discussed above, such target specification may be according to an air interface supported by a cellular phone into which the RF amplifier module (200) is to be integrated.

The RF amplifier module (200) of FIG. 2 may be used by a cellular phone manufacturer to provide functionality of RF amplification for transmission of an RF signal at a nominal output power. Such nominal output power may be different as required by different stages (e.g., a driver, a final, etc.) of an RF amplification path provided by the cellular phone, and/or a mode of operation (e.g., as defined by a corresponding air interface specification) of the cellular phone in view of several modes of operations supported by the cellular phone. Accordingly, a cellular phone manufacturer may use the DAC calibration function of the amplifier controller unit (400A) provided by the calibration and control block (436), and the output scale function of the amplifier controller unit (400A) provided by the calibration and control block (438) to further calibrate the RF output power of the RF amplifier module (200). In one exemplary case, the manufacturer of the cellular phone may set a maximum output power of the RF amplifier module (200) according to a prescribed value by first setting the gain of the calibration and control block (436) to maximum, and then using the output scale function (block 438) to adjust for the maximum output power. Once adjusted, a corresponding gain of the calibration and control block (438) may be locked via a fuse block, a write-once memory location, or any other method known to a person skilled in the art. This can ensure that under no circumstance, an output power of the RF amplifier module (200) integrated into a device may go beyond a maximum power prescribed by, for example, local laws and regulations. In turn, during operation of the cellular phone, a controller unit (e.g., a transceiver), may use the DAC calibration function provided by the calibration and control block (436) to vary the output power of the RF amplifier module (200), as requested, for example, by a base station through which the cellular phone communicates.

With further reference to FIG. 4A, the different calibration functions may have different ranges of values (i.e. current gains). For example, bias calibration and user calibration functions may each require 25% total variation. However, since the DAC calibration sets the overall output power control of the RF amplifier module (e.g. 200 of FIG. 2), it may have a total range of 16:1 (1,500%) or more.

As described above, full-scale range of the RF amplifier module (e.g. 200 of FIG. 2 using the controller 4A of FIG. 4A) may be set through the output scale calibration function (block 438), which can have the largest current range due to system requirements. With this large dynamic range also comes potential mismatch issues. Using the current invention to accommodate for these variations results in minimum area, cost and excess power consumption, thereby leading to optimum calibration control and efficiency. The output scale calibration function (block 438) may be used as a primary means to control the intended RF amplifier module output power, achieving multiple levels of output power as required by base station or handset control instructions. In LTE-CA and other linear systems, the base station typically tries to maintain equal signal-to-noise ratio, SNR, for each handset to ensure quality of service as well as optimize overall system throughput. The output scale calibration function (block 438) may also be used to accommodate mode switching between, for example, GSM and LTE modes of operation, and target power levels within the various modes.

Although the exemplary amplifier controller unit (400A) according to the present disclosure is shown in FIG. 4A to have a number of calibration and control blocks for implementing of the various calibration functions described above, such number is exemplary in nature, as other architectures similar to the block architecture depicted in FIG. 4A having different number of blocks for implementing a different number of calibration functions may be derived based on the present teachings.

The above described calibration functions through the corresponding calibration and control blocks (432, 434, 436, 438) and the temperature compensation block (420) provided by the amplifier controller unit (400A) of the present disclosure, can allow calibration of the RF amplifier module (200) of FIG. 2 due to inherent variation among amplifiers (210). According to some exemplary embodiments, temperature calibration, bias calibration and user calibration functions can each require about +/−25% full range calibration while the DAC calibration function may require a gain range between 1 and 16, and the output scale calibration function may require a gain range between 1 and 10 or more (e.g., 32). As previously noted, more or less calibration functions may be used as needed. The specific order in which the calibration and control blocks are placed in the multiplicative chain of the amplifier controller unit (400A) is determined according to a range of (multiplicative) values required of each block. Those with the smallest ranges are inserted earliest in the chain, thereby minimizing the size of the downstream blocks. This can be seen by a simple example: starting with a baseline bias current of 100% out of the current generation block (410) which can be increased to 125% by the compensation current provided by the block (420). In order to handle the temperature compensated current, the bias calibration and control block (432) must be designed for a maximum input current of 125%, and a maximum output current of 156.25% (1.25×1.25). Therefore, the user calibration and control block (434) must handle 195% of the baseline current (1.25×1.25×1.25).

Based on the above, assuming that the physical layout size of a calibration and control block is approximately proportional to its maximum output current requirement, then the user calibration and control block (434) layout area is 1.95x, where X is a normalized area for a calibration and control block of unity output current (i.e., the 100% starting point). If, however, the DAC calibration and control block (436) is placed before the user calibration and control block (434), then the user calibration and control block (434) must be 16 times larger to handle the maximum output current from the DAC calibration and control block (436). In other words, its layout area is at 1.25×1.25×16, or an area of 25X. The architecture of the amplifier controller unit of the present disclosure has therefore a beneficial area savings of 1.95/25, or about 92%, as compared to the inverse lineup. A primary advantage of the current invention is the area and design savings resultant from the optimal lineup.

With further reference to the amplifier controller unit (400A) of FIG. 4A, the DAC calibration and control block (436) may be placed before the output scaling calibration and control block (438) to provide the necessary biasing current to drive the final output power levels of the RF amplifier module (200). This allows the RF amplifier module (200) to provide maximum high-power-mode output power, often 0.5 W, or 27 dBm, as well as minimum output power, often 0.1 W, or 20 dBm, under control of the DAC calibration and control block (436).

As previously noted, power consumption in the amplifier controller unit (e.g. 400A of FIG. 4A) according to the present disclosure can be reduced since current handling capability required by each of the calibration and control blocks (432, 324, 436, 438) can be reduced. A person skilled in the art would understand that any circuit block (e.g. 432, 434, 436, 438) that requires more total output current can also create a proportionally higher amount of wasted power (and heat). Cost benefits of the current invention are also noteworthy, although not in the same proportion as size and power consumption.

With further reference to the temperature compensation block (420), such temperature compensation may be necessary to compensate output power variation of the RF amplifier module (e.g. 200 of FIG. 2) based on changes in ambient temperature. For a corresponding amplifier controller unit, such as the amplifier controller unit (400A) depicted in FIG. 4A, temperature compensation of its output bias current, $I_B$, may be necessary to ensure consistent RF performance. In some cases, a complementary to absolute temperature (CTAT) compensation scheme may be required, where an increase in ambient temperature requires a compensating decrease in a bias current of the amplifier. In other cases, a proportional to absolute temperature (PTAT) compensation may be required, where an increase in the ambient temperature requires a compensating increase in the bias current of the amplifier. The required compensation scheme may not be known till the controller unit and a corresponding amplifier are integrated into an RF amplifier module. In some cases, successive iterations (rapid prototypes) of a product may require different temperature-compensation schemes. Accordingly, the temperature compensation block (420) of the amplifier controller unit (400A) of the present disclosure may include functionality of both the PTAT and the CTAT compensation schemes for added flexibility, as shown in FIG. 6A.

Figure 6A:
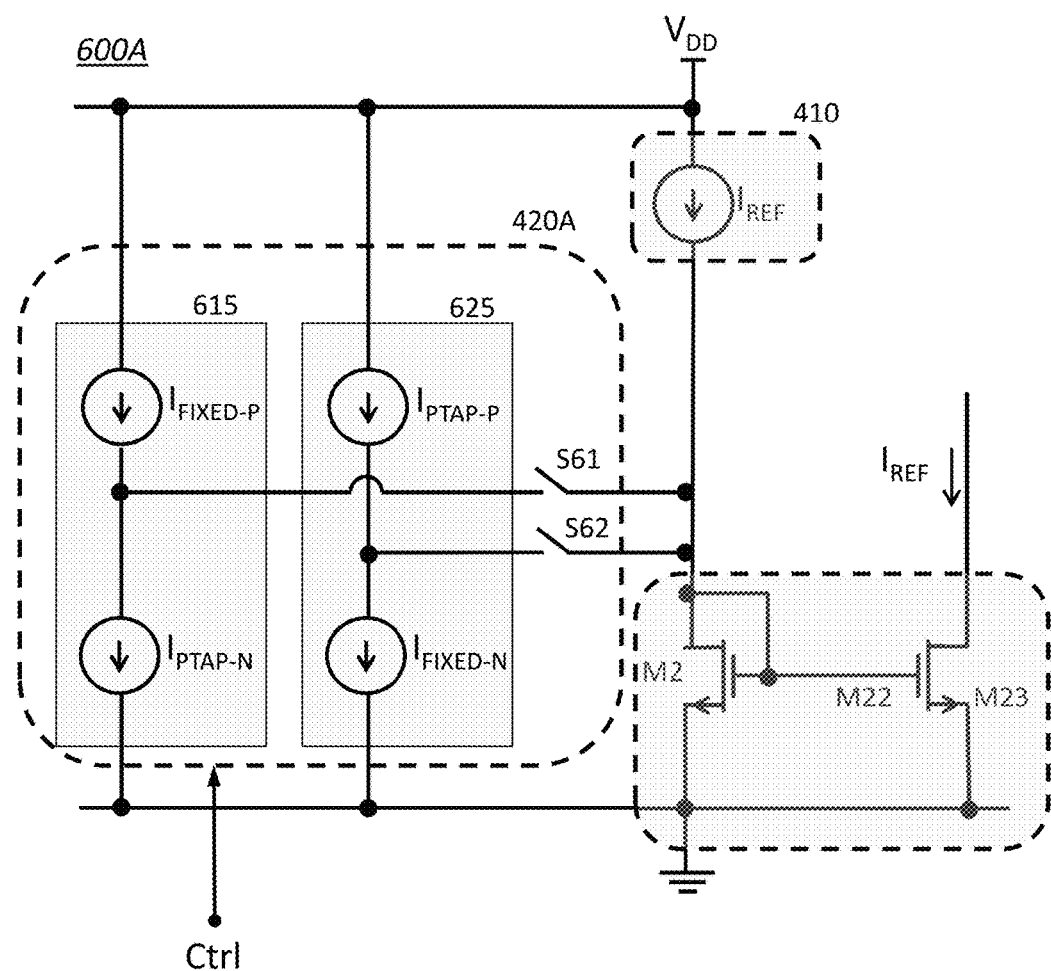
FIG. 6A shows an exemplary embodiment of a simplified temperature compensation circuit which can selectively compensate a positive current drift and a negative current drift with respect to temperature variation. Such temperature compensation circuit comprises a current source circuit which can selectively add a compensation current to a drifting reference current, and a current sink circuit which can selectively subtract a compensation current from the drifting reference current.

FIG. 6A shows a simplified block diagram of the reference current generator block (410) and a temperature compensation block (420A) according to an exemplary embodiment of the present disclosure, where the temperature compensation block (420A) comprises a CTAT compensation control circuit (615) and a PTAT compensation control circuit (625). Selection of the temperature compensation scheme is provided through switches (S61, S62) respectively selecting and deselecting the CTAT and the PTAT compensation scheme. Control signal, Ctrl, can control configuration of the temperature compensation block (420A), including states of the switches (S61, S62), as well as calibration of the compensation control circuits (615, 625). Calibration of the compensation control circuits (615, 625) can adjust a temperature compensation rate (slope) of each of the two compensation schemes. The compensation control circuits (615, 625) can provide adjustable CTAT and PTAT compensation by reducing the overall current profile into a temperature-independent component and a temperature-dependent component.

Figure 6B:
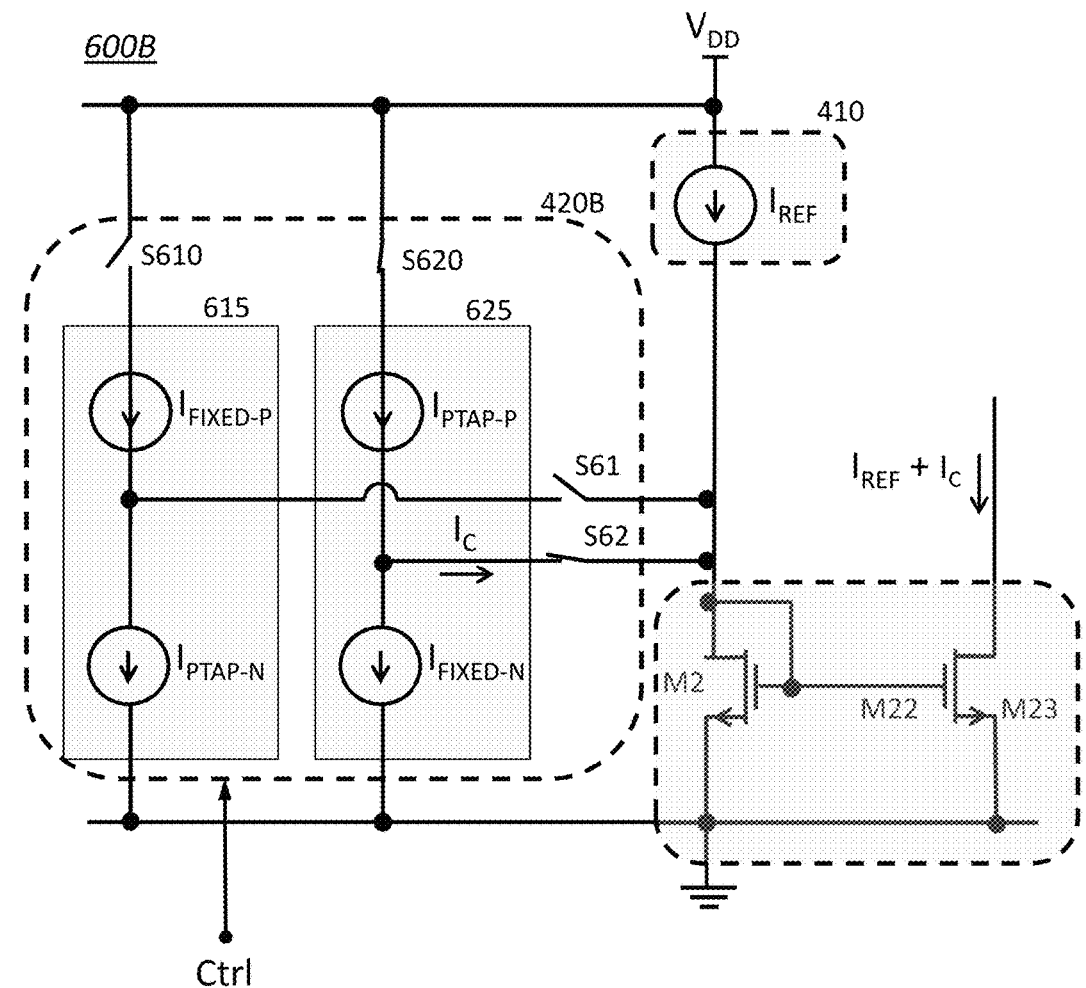
FIG. 6B shows a variation of the simplified temperature compensation circuit depicted in FIG. 6A, where the current source circuit and the current sink circuit can be selectively activated and deactivated.

As shown in the exemplary embodiment depicted in FIG. 6A, the compensation control circuit (625) synthesizes the PTAT temperature-dependent component by subtracting a current that is fixed with respect to temperature, $I_{FIXED-N}$, from a PTAT current source that is proportional to temperature, $I_{PTAT-P}$, to result in a desired current (temperature compensation slope), when added to the reference current, $I_{REF}$, by closing the switch S62 (as shown in FIG. 6B). Also, as shown in FIG. 6A, the compensation control circuit (615) synthesizes the CTAT temperature-dependent component by subtracting a current source, $I_{PTAP-N}$, that is proportional with respect to temperature, from a fixed current, $I_{FIXED-P}$, that is fixed with respect to temperature, to result in a desired current (temperature compensation slope), when subtracted from the reference current, $I_{REF}$, by closing the switch S62.

Although not shown in the FIG. 6A, each of the compensation control circuits (615, 625) may provide calibration of their respective compensation currents added/subtracted to/from the reference current by calibrating (scaling up/down through current gain) each of their current components (e.g. $I_{PTAP-N}$, $I_{FIXED-P}$, $I_{PTAP-P}$, $I_{FIXED-N}$) through a variable-gain current amplification circuit, such as, for example, the current mirror (300) shown in FIG. 3, to allow for an optimum slope of the temperature compensation scheme. Once calibrated, a corresponding calibration setting may be locked via a fuse block, a write-once memory location, or any other method known to a person skilled in the art. Alternatively, the calibration setting may be simply stored in a memory location and updated as necessary. The compensation control circuits (615, 625) can therefore allow for a parametric gain, yielding a programmable gain for temperature compensation which can be used for setting a temperature compensation slope for both PTAT and CTAT current compensation schemes.

Once one of the PTAT and CTAT compensation schemes is selected (as needed), the deselected compensation scheme may be deactivated so as to reduce overhead power consumed by a corresponding compensation control circuit of the deselected compensation scheme. An exemplary embodiment, according to the present disclosure, that allows deactivation and activation of the compensation control circuits (615, 625) is shown in FIG. 6B, where switches (610, 620) are used to respectively provide power (e.g. $V_{DD}$) to the circuits (615, 625). In the exemplary embodiment depicted in FIG. 6B, the PTAT compensation scheme is selected, thereby closing the switches (S62, S620) for activation of, and selection of compensation current from, the compensation control circuit (625). Furthermore, switches (S61, S610) are open, so as to remove power from the compensation control circuit (615) and disconnect such circuits from the reference current generation block (410). A person skilled in the art would know of many ways to activate/deactivate the compensation control circuits (6515, 625), and therefore the exemplary embodiment depicted in FIG. 6B should not be considered as limiting what the applicant considers to be the invention.

As noted above with reference to the amplifier controller unit according to the present disclosure (e.g. 400A, 400B of FIGS. 4A, 4B), an output current $I_B$ of the amplifier controller may be based on a reference current $I_{REF}$ that is scaled up through a multiplicative current chain comprising one or more calibration and control blocks (e.g. 432, 434, 436, 438). According to an embodiment of the present disclosure, it may be desirable to provide an offset current adjustment block to the amplifier controller unit to allow addition of an offset current $I_{OFFSET}$ to the current output by the multiplicative current chain, as shown in FIG. 7A.

Figure 7A:
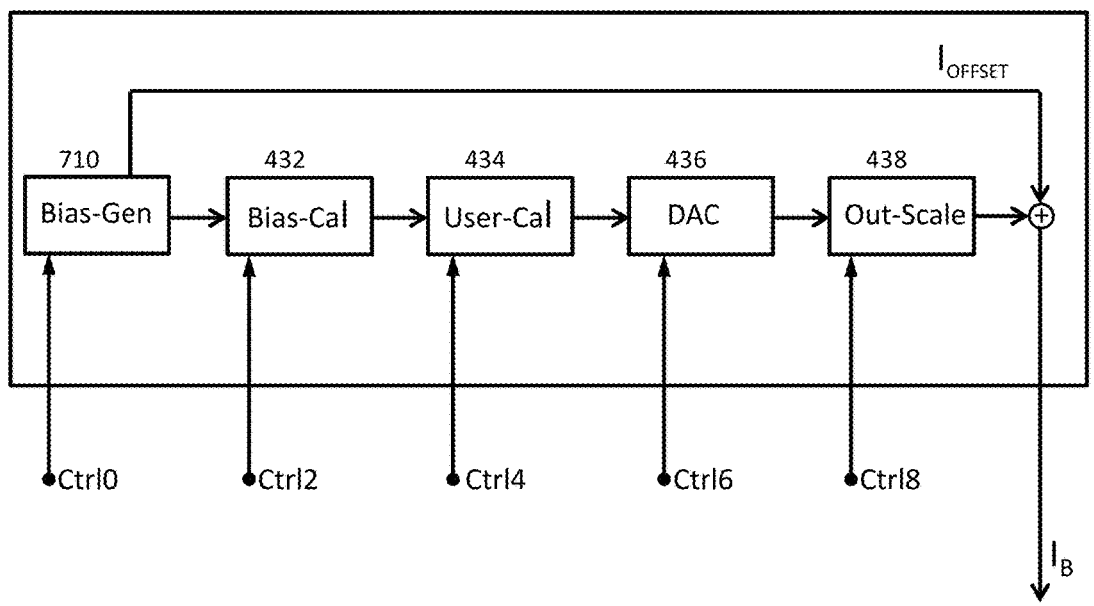
FIG. 7A and FIG. 7B show variations of the amplifier controller of FIG. 4A and FIG. 4B, where an offset current is added to an output current of the amplifier controller.

With reference to FIG. 7A, an amplifier controller unit (700A) is presented that is based on the amplifier controller unit (400A, 400B of FIGS. 4A, 4B) where a fixed offset current $I_{OFFSET}$ is added to the current output of the last calibration and control block (438), to output a net output current $I_B$. According to an embodiment of the present disclosure, the fixed offset current $I_{OFFSET}$ may be provided by a Bias-Gen block (710) that may include combined functionalities of the reference current generation block (410) and the temperature compensation block (420) described above in reference to the amplifier controller unit (400A, 400B). According to an embodiment of the present disclosure, the fixed offset current $I_{OFFSET}$ output by the Bias-Gen block (710) may be same or different from the reference current $I_{REF}$ provided to the calibration and control block (432). According to a further embodiment of the present disclosure, the fixed offset current $I_{OFFSET}$ may be according to a desired calibrated value of the output current $I_B$ for a given current amplification provided by the calibration and control blocks (432, 434, 436, 438).

Figure 7B:
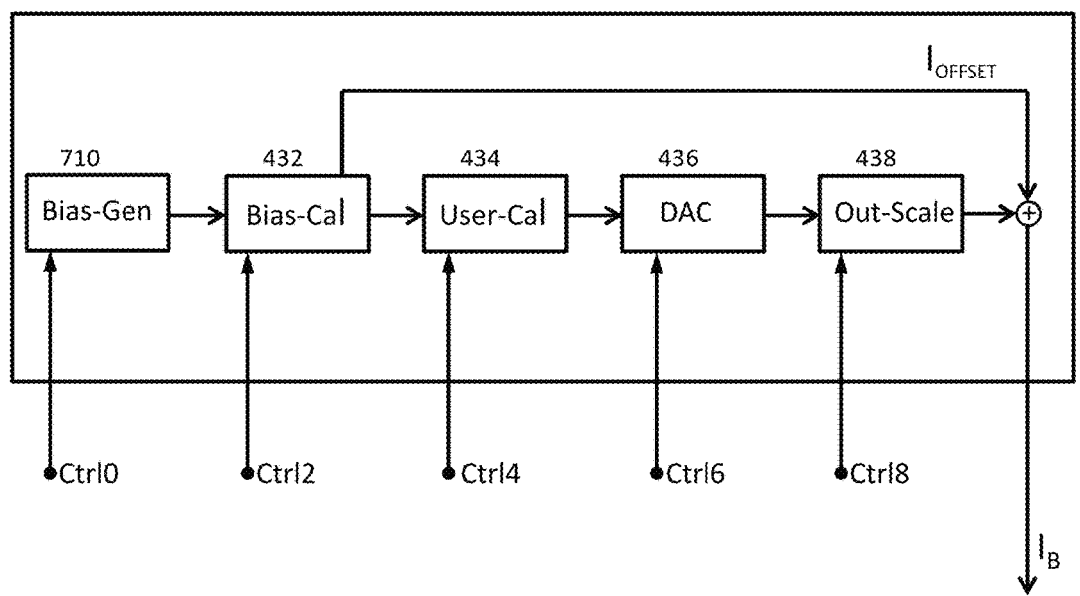

According to a further embodiment of the present disclosure, an offset current $I_{OFFSET}$ may be provided by the calibration and control block (432), as shown in FIG. 7B. According to an exemplary embodiment of the present disclosure, the offset current $I_{OFFSET}$ provided in the amplifier controller units (700B) of FIG. 7B may be a fixed offset current, and therefore independent from a current amplification provided, via control signal Ctrl2, by the calibration and control block (432).

According to a further exemplary embodiment of the present disclosure, the offset current $I_{OFFSET}$ provided in the amplifier controller units (700B) of FIG. 7B may be adjustable and based on a current amplification provided, via control signal Ctrl2, by the calibration and control block (432). It should be noted that in this case, freedom of adjusting the offset current $I_{OFFSET}$ may be limited as the control signal Ctrl2 may foremost be used to calibrate the output current of the calibration and control block (432). A person skilled in the art would understand that any of the calibration and control blocks (710, 432, 434, 436, 438), or an additional calibration and control block (not shown), may be used to provide the offset current $I_{OFFSET}$ in a manner similar to one described in relation to FIGS. 7A, 7B.

Figure 8:
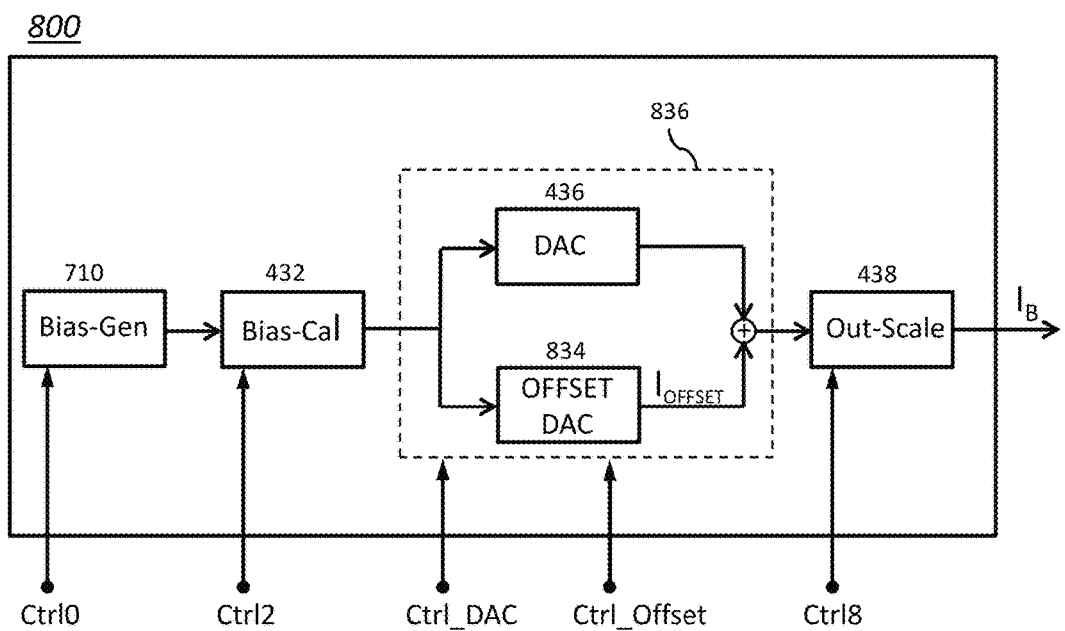
FIG. 8 shows a block diagram of an exemplary embodiment according to the present disclosure of an amplifier controller unit where a multiplicative current chain comprising an offset current adjustment block is used, the multiplicative current chain comprising calibration and control blocks arranged in a specific order.

According to an embodiment of the present disclosure, it may be desirable to include an offset current adjustment block to the amplifier controller unit to allow addition of a programmable offset current $I_{OFFSET}$ to the output current $I_B$, as shown in FIG. 8. As shown in FIG. 8, the amplifier controller unit (800) according to an embodiment of the present disclosure comprises a plurality of calibration and control blocks (432, 836, 438) that provide a multiplicative current chain for scaling up of the reference current $I_{REF}$ to provide an output current $I_B$. The calibration and control block (836) comprises two calibration and control blocks (436) and (834) whose outputs are summed together and provided to the following calibration and control block (438) of the multiplicative current chain. According to an embodiment of the present disclosure, each of the two current amplification blocks (436, 834) are provided with a current output by the prior calibration and control block (432) of the multiplicative current chain. A person skilled in the art would realize that more or less calibration and control blocks may be present in the multiplicative current chain of the amplifier controller unit depicted in FIG. 8. For example, the User-Cal block (434) shown, for example, in FIGS. 7A, 7B, may be reintroduced in the embodiment of FIG. 8.

According to an embodiment of the present disclosure, the calibration and control block (834) may serve as an offset current adjustment block that outputs a programmable offset current $I_{OFFSET}$ that is added to a current amplified by the calibration and control block (436). This allows to introduce the programmable offset current $I_{OFFSET}$ in the multiplicative current chain.

According to an exemplary embodiment of the present disclosure, a step size of the current amplification provided by the calibration and control block (834) may be substantially smaller than a step size of the current amplification provided by the calibration and control block (436). As used herein, the expression "step size" refers to an incremental output current value based on a single bit increment of the input control signal (e.g. Ctrl_DAC, Ctrl_Offset) to the current amplifier. In other words, the programmable offset current $I_{OFFSET}$ may be used to adjust (via addition) the current output by the calibration and control block (436) within a subrange of a current control capability range of the calibration and control block (436).

With further reference to FIG. 8, it should be noted that each of the calibration and control blocks (436) and (834) may be controlled independently via respective control signals Ctrl_DAC and Ctrl_Offset. In other words, current amplification provided by the calibration and control block (436) may be independently controlled from the programmable offset current $I_{OFFSET}$ generated by the calibration and control block (834).

According to an exemplary non-limiting embodiment of the present disclosure, each of the Ctrl_DAC and Ctrl_Offset signals may be represented by a 4-bit digital value, for a total of sixteen possible current amplification levels at the output of each of the calibration and control blocks (436) and (834). In this case, the current amplification range (e.g. defined by lower to higher gain) of the calibration and control block (834) may be chosen to be substantially smaller than the current amplification range of the calibration and control block (436) for a substantially smaller current amplification step size of the calibration and control block (834). A person skilled in the art would realize that the 4-bit digital value is just and exemplary value as, depending on design goals and specification, each of the Ctrl_DAC and Ctrl_Offset may be represented by an N-bit digital value, where N may take, for each case, any integer value.

With further reference to FIG. 8, a person skilled in the art would realize that the calibration and control block (836) may be built based on any of the calibration and control blocks (e.g. 432, 434, 436, 438) of a multiplicative current chain as described in reference to FIGS. 4A and 4B. A person skilled in the art would realize that the amplifier controller unit (800) of FIG. 8 is based on the amplifier controller units (400A, 400B) of FIGS. 4A, 4B, where a current amplification path (provided via calibration and control block 834) that is parallel to a main current amplification path (provided via calibration and control block 436) is used to generate the programmable offset current $I_{OFFSET}$ that is added to the main current amplification path. The person skilled in the art would also realize that $I_{OFFSET}$ contributed by the calibration and control block (836) will be multiplied by the calibration and control block (438) due to its location in the overall multiplication chain (whereas $I_{OFFSET}$ of FIGS. 7A and 7B is added in after the calibration and control block 438), which is another reason its current amplification range may need to be smaller than that of other calibration and control blocks.

The amplifier controller unit (e.g. 400A, 400B, 700A, 700B, 800) according to the present teachings allows minimizing area and power consumption, while increasing flexibility and accuracy. By integrating such amplifier control unit into an amplifier module, added flexibility can be provided that allows tight specification, size and cost targets of the amplifier module to be met. The amplifier controller unit of the present disclosure may be monolithically integrated in an integrated circuit fabricated according to any technology known to a person skilled in the art, including, and not limited to, for example, CMOS, CMOS SOI and CMOS SOS.

The examples set forth above are provided to give those of ordinary skill in the art a complete disclosure and description of how to make and use the embodiments of the universal RF amplifier controller of the present disclosure, and are not intended to limit the scope of what the applicant considers to be the invention. Such embodiments may be, for example, used within mobile handsets for current communication systems (e.g. WCMDA, LTE, LTE-CA, WiFi, etc.) wherein amplification of signals with frequency content of above 100 MHz and at power levels of above 50 mW may be required. The skilled person may find other suitable implementations of the presented embodiments.

The term "MOSFET", as used in this disclosure, means any field effect transistor (FET) with an insulated gate and comprising a metal or metal-like, insulator, and semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET structures), or in hybrid or discrete circuit forms. Integrated circuit embodiments may be fabricated using any suitable substrates and processes, including but not limited to standard bulk silicon, silicon-on-insulator (SOI), and silicon-on-sapphire (SOS). Unless otherwise noted above, the invention may be implemented in other transistor technologies such as bipolar, GaAs HBT, GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS enables low power consumption, the ability to withstand high power signals during operation due to FET stacking, good linearity, and high frequency operation (i.e., radio frequencies up to and exceeding 50 GHz). Monolithic IC implementation is particularly useful since parasitic capacitances generally can be kept low (or at a minimum, kept uniform across all units, permitting them to be compensated) by careful design and matching components is typically much better in monolithic implementations.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functional without significantly altering the functionality of the disclosed circuits.

A number of embodiments according to the present disclosure have been described. It is to be understood that various modifications may be made without departing from the spirit and scope of such embodiments. For example, some of the steps described above may be order independent, and thus can be performed in an order different from that described. Further, some of the steps described above may be optional. Various activities described with respect to the methods identified above can be executed in repetitive, serial, or parallel fashion.

It is to be understood that the foregoing description is intended to illustrate and not to limit the scope of the disclosure, which is defined by the scope of the following claims, and that other embodiments are within the scope of the claims. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

The invention claimed is:

1. A circuital arrangement comprising:
a plurality of calibration and control blocks arranged in a cascaded configuration, each calibration and control block of the plurality of calibration and control blocks configured to act on an input current to provide a calibrated output current that is an amplified version of the input current according to a current amplification range of the each calibration and control block, the current amplification range having a low value and a high value; and
an offset current generator configured to generate an offset current that is added to the calibrated output current of one calibration and control block of the plurality of calibration and control blocks,
wherein the plurality of calibration and control blocks are configured to amplify a reference current provided to a first calibration and control block of the plurality of calibration and control blocks and generate a calibrated control current adapted to control an output power of a radio frequency (RF) amplifier.

2. The circuital arrangement according to claim 1, wherein an arrangement order by which the plurality of calibration and control blocks are arranged in the cascaded configuration is according to the high value of the current amplification range of the each calibration and control block, starting from a lowest high value and ending at a highest high value.

3. The circuital arrangement according to claim 1, wherein the offset current is a fixed current added to the calibrated output current of a last calibration and control block of the cascaded configuration.

4. The circuital arrangement according to claim 3, wherein the offset current generator is part of a reference current generator configured to generate the reference current.

5. The circuital arrangement according to claim 4, wherein the offset current is substantially larger that the reference current.

6. The circuital arrangement according to claim 3, wherein the offset current generator is part of a calibration and control block of the plurality of calibration and control blocks.

7. The circuital arrangement according to claim 1, wherein the offset current generator is a calibration and control block coupled in parallel with one calibration and control block of the plurality of calibration and control blocks, the offset current generator configured to act on the input current to the one calibration and control block of the plurality of calibration and control blocks and generate the offset current that is an amplified version of the input current according to a current amplification range of the offset current generator.

8. The circuital arrangement according to claim 7, wherein a low value of the current amplification range of the calibration and control block that generates the offset current is substantially smaller than a low value of the current amplification range of the one calibration and control block of the plurality of calibration and control blocks.

9. The circuital arrangement according to claim 2, wherein the each calibration and control block comprises a plurality of transistors sized according to the arrangement order.

10. The circuital arrangement according to claim 1, wherein the lowest high value of the current amplification range is 1.25 and the highest high value of the current amplification range is 32.

11. The circuital arrangement according to claim 2, wherein the plurality of calibration and control blocks comprises at least four calibration and control blocks arranged in the cascaded configuration, each having a respective high value of the current amplification range of 1.25, 1.25, 16 and 32.

12. The circuital arrangement according to claim 11, wherein each of the at least four calibration and control blocks have a respective low value of the current amplification range of 0.75, 0.75, 1 and 1.

13. The circuital arrangement according to claim 1, wherein the each calibration and control block is a parametric current mirror comprising:
a first leg that receives the input current, the first leg comprising a first transistor;
a second legs that mirrors the input current of the first leg, the second leg comprising a second transistor and a plurality of second transistors selectively coupled in parallel to the second transistor;
wherein a ratio of a current in the second leg to the input current of the first leg is proportional to a ratio of a size of the second transistor summed with sizes of selected transistors of the plurality of second transistors to a size of the first transistor.

14. The circuital arrangement according to claim 13, wherein the parametric current mirror comprises a plurality of switches coupled to the plurality of second transistors, the plurality of switches configured to selectively couple in parallel any of the plurality of second transistors to the second transistor.

15. The circuital arrangement according to claim 13, wherein the parametric current mirror comprises FET transistors of a same type, the type comprising one of a N-type and P-type.

16. The circuital arrangement according to claim 15, wherein the FET transistors of two consecutive parametric current mirrors are of different types.

17. The circuital arrangement according to claim 1, further comprising a current source that generates the reference current.

18. The circuital arrangement according to claim 17, further comprising a temperature compensation circuit configured to compensate a drift of the reference current with respect to temperature variation.

19. The circuital arrangement according to claim 18, wherein the temperature compensation circuit is configured to selectively provide one of a proportional to absolute temperature (PTAT) compensation scheme, and a complementary to absolute temperature (CTAT) compensation scheme.

20. The circuital arrangement according to claim 19, wherein the temperature compensation circuit comprises:
a PTAT compensation circuit configured to source a compensation current that is added to the reference current, and
a CTAT compensation circuit configured to sink a compensation current that is subtracted from the reference current.

21. The circuital arrangement according to claim 20, wherein the PTAT compensation circuit and the CTAT compensation circuit each comprises a first current source that is fixed with respect to the temperature variation, and a second current source that is proportional to the temperature variation.

22. The circuital arrangement according to claim 21, wherein the PTAT compensation circuit subtracts the first current from the second current to source the compensation current, and wherein the CTAT compensation circuit subtracts the second current from the first current to sink the compensation current.

23. The circuital arrangement according to claim 21, wherein the first current source and the second current source each comprise a parametric current mirror configured to calibrate a current compensation slope with respect to temperature of the current compensation current.

24. The circuital arrangement according to claim 20, wherein the PTAT compensation circuit and the CTAT compensation circuit can selectively be activated and deactivated through a switch.

25. An amplifier module comprising:
the circuital arrangement according to claim 1, and
an RF amplifier coupled to the circuital arrangement to receive the calibrated control current generated by the circuital arrangement,
wherein an output power of the RF amplifier is proportional to the calibrated control current.

26. An electronic device comprising the amplifier module according to claim 25, the electronic device configured to operate on one or more air interface protocols, including a long term evolution carrier aggregation (LTE-CA).

27. A method for controlling an output power of a radio frequency (RF) amplifier, the method comprising:
providing a plurality of calibration and control blocks arranged in a cascaded configuration, each calibration and control block of the plurality of calibration and control blocks configured to act on an input current to provide a calibrated output current that is an amplified version of the input current according to a current amplification range of the each calibration and control block, the current amplification range having a low value and a high value; and
adding an offset current to the calibrated output current of one calibration and control block of the plurality of calibration and control blocks,
wherein the plurality of calibration and control blocks are configured to amplify a reference current provided to a first calibration and control block of the plurality of calibration and control blocks and generate a calibrated control current adapted to control the output power of the radio frequency (RF) amplifier.

28. The method according to claim 27, further comprising:
arranging the plurality of calibration and control blocks in the cascaded configuration according to an arrangement order based on the high value of the current amplification range of the each calibration and control block, starting from a lowest high value and ending at a highest high value.

29. The method according to claim 27, further comprising:
determining a size of transistors for use in the each calibration and control block based on the high value of the each calibration and control block;
based on the determining, monolithically fabricating the plurality of calibration and control blocks in an integrated circuit; and
based on the fabricating, reducing a physical size of the circuital arrangement.

30. The method according to claim 27, further comprising:
coupling in parallel to one calibration and control block of the plurality of calibration and control blocks, a parallel coupled calibration and control block configured to act on the input current to the one calibration and control block of the plurality of calibration and control blocks to generate the offset current that is an amplified version of the input current according to a current amplification range of the parallel coupled calibration and control block.

* * * * *